(12) United States Patent
Lesperance et al.

(10) Patent No.: US 11,131,739 B2
(45) Date of Patent: Sep. 28, 2021

(54) CALIBRATION STANDARD FOR PARTIAL DISCHARGE MEASUREMENT

(71) Applicant: GM GLOBAL TECHNOLOGY OPERATIONS LLC, Detroit, MI (US)

(72) Inventors: Ronald M. Lesperance, Troy, MI (US); John S. Agapiou, Rochester Hills, MI (US); Thomas A. Perry, Bruce Township, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 148 days.

(21) Appl. No.: 16/405,043

(22) Filed: May 7, 2019

(65) Prior Publication Data

US 2020/0355776 A1 Nov. 12, 2020

(51) Int. Cl.
*G01R 35/00* (2006.01)
*G01R 31/12* (2020.01)
*G01R 31/319* (2006.01)

(52) U.S. Cl.
CPC ....... *G01R 35/005* (2013.01); *G01R 31/1245* (2013.01); *G01R 31/31903* (2013.01)

(58) Field of Classification Search
CPC ...... G01R 35/00; G01R 35/005; G01R 31/34; G01R 31/319; G01R 31/31903; G01R 31/12; G01R 31/1245; G01R 31/1272
See application file for complete search history.

(56) References Cited

U.S. PATENT DOCUMENTS

| 5,612,930 A * | 3/1997 | Hazony ................. G01H 3/00 310/336 |
| 9,046,577 B2 | 6/2015 | Agapiou et al. |
| 9,482,710 B2 | 11/2016 | Agapiou et al. |
| 2005/0168096 A1* | 8/2005 | Joho .................. H02K 3/14 310/213 |
| 2011/0037666 A1* | 2/2011 | Behrmann ............ G01R 31/34 343/703 |
| 2015/0285849 A1* | 10/2015 | Sako .................. G01R 27/2605 324/538 |
| 2019/0285441 A1* | 9/2019 | Andie ................. H01R 4/2483 |

* cited by examiner

*Primary Examiner* — Son T Le (57) ABSTRACT

A partial discharge calibration standard apparatus may include a first and second rigid members defining respective first and second facing surfaces. An electrically insulating material may be disposed between the facing surfaces. The apparatus may further include a pressure member maintaining the rigid members together, thereby fixing the first and second facing surfaces in a substantially parallel spaced relation across the insulating material such that a partial discharge threshold magnitude for an electrical potential difference between the first and second facing surfaces is determined. The insulating material may prevent a partial discharge of an electrical potential from the first facing surface to the second facing surface below the partial discharge threshold magnitude, while allowing the electrical potential difference to be discharged from the first facing surface to the second facing surface through the insulating material when the electrical potential difference is increased to the partial discharge threshold magnitude.

19 Claims, 4 Drawing Sheets

CALIBRATION STANDARD FOR PARTIAL DISCHARGE MEASUREMENT

INTRODUCTION

Electric motors, e.g., for vehicles, typically include a stator which creates a variable magnetic field to impart movement to a rotor. Typically, the stator includes multiple conductive elements or windings fixed within an electrically insulating medium, e.g., in a multi-phase alternating current motor configuration.

Defects in the insulating medium of a stator, e.g., voids, may create paths for a partial discharge of current from the windings, decreasing performance of the electric motor and further degrading the electrical insulation over time, possibly resulting in a short or other failure of the motor. Accordingly, it is necessary to rigorously check stator quality.

In one example, resistance of the stator to partial discharges is measured directly. A partial discharge test system may send high voltage pulses through the phase winding(s) of a stator, and check for occurrence of a partial discharge. Partial discharge occurrence may be indicated by noise observed in the voltage measurement of the test pulse(s), ultrasonic acoustic noise, or other indications of distortion or loss of voltage in the test pulse transmitted through the stator winding(s).

At present, there is no device or instrument available for evaluating or calibrating a partial discharge measurement system. As a result, it is unknown whether a partial discharge measurement system is accurately measuring partial discharge events, particularly in light of the lack of repeatability inherent in partial discharge events.

Accordingly, there is a need for an improved method and/or system for measuring partial discharge events that addresses the above shortcomings.

SUMMARY

In at least some example embodiments, a partial discharge calibration standard apparatus may include a first electrically conductive rigid member defining a first facing surface having a first surface area of a first magnitude, and a second electrically conductive rigid member defining a second facing surface having a second surface area of a second magnitude at least as great as the first magnitude. An electrically insulating material may be disposed between the facing surfaces. The apparatus may further include a pressure member maintaining the first and second rigid members together with a force having a force magnitude, thereby fixing the first and second facing surfaces in a substantially parallel spaced relation across the insulating material such that a partial discharge threshold magnitude for an electrical potential difference between the first and second facing surfaces is determined. The insulating material may prevent a partial discharge of an electrical potential from the first facing surface to the second facing surface below the partial discharge threshold magnitude. The electrical potential difference may be discharged from the first facing surface to the second facing surface through the insulating material when the electrical potential difference is increased to the partial discharge threshold magnitude.

In at least some examples, the insulating material is a dielectric tape.

The pressure member may, in some example approaches, be configured to vary the partial discharge threshold magnitude. For example, the pressure member may be configured to vary the partial discharge threshold magnitude by one or more of:

- adjusting the force magnitude;
- adjusting a relative spacing between the first and second facing surfaces across the insulating material; and/or
- adjusting a material void magnitude between the insulating material and at least one of the facing surfaces.

In some example approaches, the insulating material defines a partial discharge path including one or more micro voids positioned between the insulating material and at least one of the facing surfaces.

The pressure member may, in at least some examples, be formed of a non-conductive material.

In some examples, the first surface area of the first facing surface is positioned within a perimeter of the second facing surface.

In at least some examples, the first and second members are each formed of a conductive material.

The first and second facing surfaces may be machined in some example approaches.

In some examples, the first and second facing surfaces are spaced apart by less than 1.0 millimeters across the electrically insulating material. In at least a subset of these examples, the first and second facing surfaces may be parallel to each other such that a distance between the first and second facing surfaces varies by no more than 40 microns.

Some example apparatuses may further include a substantially fluid-tight enclosure containing the first and second members and the pressure member.

In some examples, a ring-shaped stator body may be provided, with the first and second member and the pressure member contained within the ring-shaped stator body.

The pressure member of some example apparatuses may have a threaded portion engaging mating threads of the first member, wherein rotation of the first member adjusts the force magnitude. In at least a subset of these example approaches, the pressure member comprises an engagement portion selectively fixed to the second rigid member.

Some example illustrations are directed to a partial discharge calibration standard apparatus, which includes a first electrically conductive rigid member defining a first facing surface having a first surface area of a first magnitude and a second electrically conductive rigid member defining a second facing surface having a second surface area of a second magnitude at least as great as the first magnitude. The apparatus may further include an electrically insulating material disposed between the facing surfaces, the electrically insulating material comprising a dielectric tape defining a plurality of voids therein, and a pressure member maintaining the first and second rigid members together with a force having a force magnitude. The pressure member may thereby fix the first and second facing surfaces in a substantially parallel spaced relation across the insulating material such that a partial discharge threshold magnitude for an electrical potential difference between the first and second facing surfaces is determined, wherein the insulating material prevents partial discharge of an electrical potential from the first facing surface to the second facing surface below the partial discharge threshold magnitude, and partially discharges the electrical potential difference from the first facing surface to the second facing surface through the insulating material when the electrical potential difference is increased to the partial discharge threshold magnitude, wherein the pressure member is configured to vary the partial discharge threshold magnitude by adjusting a material void magnitude between the insulating material and at least one of the facing surfaces.

In other example illustrations, a stator test apparatus is provided, which includes a ring-shaped body and a partial discharge standard apparatus disposed within the body. The partial discharge standard apparatus may include a first electrically conductive rigid member defining a first facing surface having a first surface area and a second electrically conductive rigid member defining a second facing surface having a second surface area encompassing the first surface area. The partial discharge standard apparatus may further include an electrically insulating material disposed between the facing surfaces, the electrically insulating material comprising a dielectric tape defining a plurality of voids therein. The partial discharge standard apparatus may also include an electrically non-conductive pressure member maintaining the first and second members together, thereby fixing the first and second facing surfaces in spaced relation across the insulating material, with the first and second facing surfaces spaced apart in a substantially parallel orientation, thereby forming a partial discharge path from the first facing surface to the second facing surface through the insulating material. The pressure member may be configured to vary an applied force between the first and second facing surfaces, thereby varying an electrical potential threshold for the partial discharge path across the insulating material, wherein the pressure member is configured to vary the partial discharge threshold magnitude by adjusting a material void magnitude between the insulating material and at least one of the facing surfaces.

In at least some examples of a stator test apparatus, a substantially fluid-tight enclosure may also be provided, which contains the first and second members and the pressure member.

BRIEF DESCRIPTION OF THE DRAWINGS

One or more embodiments of the invention will hereinafter be described in conjunction with the appended drawings, wherein like designations denote like elements, and wherein.

DETAILED DESCRIPTION

Example illustrations described herein include apparatuses that are configured to generate a repeatable partial discharge (PD) event at a known or predetermined pulse voltage. The apparatus may allow for adjustments to produce a PD when a specific high voltage pulse from a PD measurement system is applied to the leads or terminals of the device. The apparatus may be used to confirm that the PD test equipment is working properly. For example, if the PD test equipment detects a PD event at the specified voltage upon application to the apparatus, this may demonstrate that the PD test equipment is properly calibrated. By generating a PD event consistently with the apparatus at a known pulse voltage, the apparatus can be used to test PD detection systems that use different sensors such as antenna, microphone, electronic filters, etc.

In some examples, a PD calibration standard apparatus uses two parallel steel plates or members. The plates/members may define facing surfaces that are separated by an insulating material. One of the plates may be larger than the other, and the smaller plate may be positioned within a perimeter of the larger plate. The plates may be held rigidly in place by a relatively stiff supporting structure, with the top plate being electrically isolated from the bottom plate, e.g., by way of the insulating material. A pressure member or housing may be used to force the plates together in spaced relation (separated by the insulating material). In some examples, the pressure member may be a one-piece or monolithic structure with an upper one of the plates, with an insulating layer or spacer(s) between the housing and the upper plate. The top plate may be supported within the pressure member/housing with a relatively tight fit to ensure adequate sliding friction to maintain the upper and lower plates together with a relatively high force or pressure, as will be discussed further below. Generally, the pressure member and plates may be relatively stiff, sufficiently to minimize relative motion between the plates, e.g., as may be caused by forces created when a relatively high voltage pulse is applied across the plates. The apparatus may also be placed within an environmental chamber with a controlled humidity.

In another example, a partial discharge calibration standard apparatus may be incorporated within a housing or structure that facilitates installation of the apparatus into a stator testing stand. In some examples, the apparatus may be incorporated into an actual stator having an insulating medium which generally provides a structure supporting multiple phase windings. However, the apparatus may be incorporated within any structure that provides appropriate size, mounting points, etc. to facilitated positioning the apparatus within a stator test stand. In some examples, a partial discharge calibration standard apparatus is incorporated within a "dummy" stator, with electrical leads electrically connecting the plates to the dummy stator such that an applied electrical test pulse is transmitted to the partial discharge calibration standard apparatus. With the appropriately calibrated (i.e., such that a partial discharge is reliably generated at a known test pulse voltage) partial discharge calibration standard apparatus incorporated within the dummy stator, a standard PD test can be run to ensure the test apparatus is accurately detecting partial discharge at a desired test pulse voltage.

Turning now to FIGS. 1A-1D, an example vehicle partial discharge calibration standard apparatus 100 is illustrated. The apparatus 100 may include two electrically conductive rigid members 102, 104, each having respective first and second facing surfaces 110, 112. The rigid members 102, 104 may be formed of any conductive material that is convenient, e.g., a metallic material such as steel. As will be discussed further below, relatively high strength materials such as steel may advantageously facilitate adjustment of a partial discharge (PD) threshold of the apparatus 100. The facing surfaces 110, 112 may be formed substantially parallel to each other. For example, the facing surfaces 110, 112 may define planar surfaces that do not vary by more than 20 microns (μm) (i.e., in a direction parallel to an axis A-A of the first member 102) in area(s) where the facing surfaces 110, 112 are adjacent. In one example, the facing surfaces 110, 112 are each machined in the first and second members 102, 104, respectively to create a desired level of surface roughness to create voids 118 (See FIG. 1D) when the facing surfaces 110, 112 are compressed against the insulating material 114, as will be discussed further below. Accordingly, a separation distance between the facing surfaces 110, 112 may, in some examples, vary no more than 40 microns.

Figure 1A:
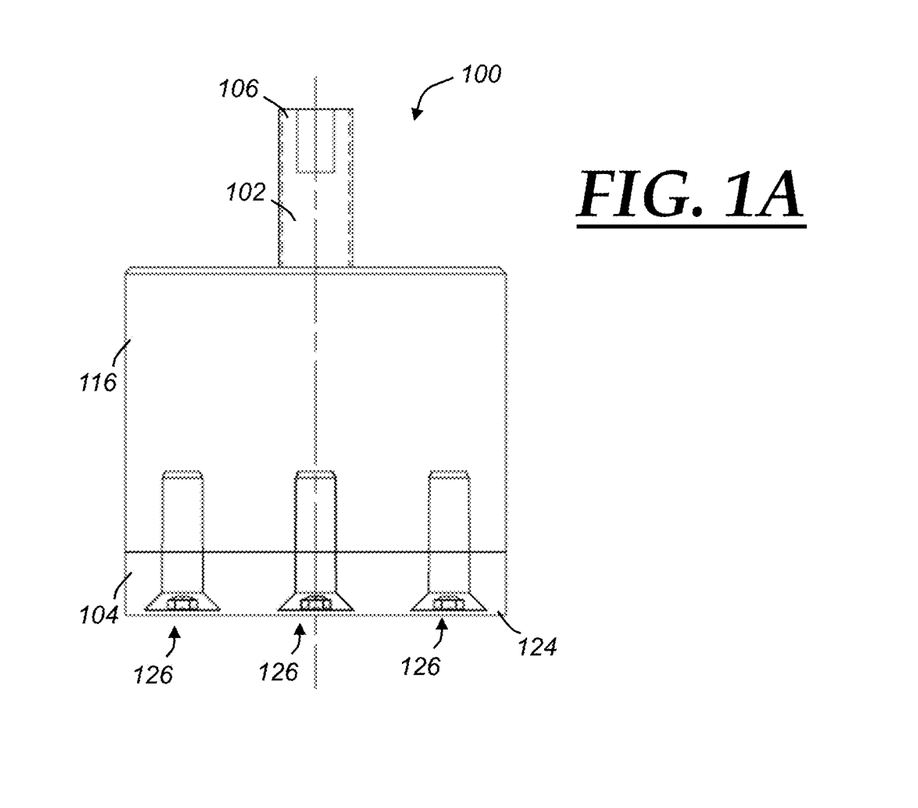
FIG. 1A is a front view of a partial discharge calibration standard apparatus, according to one example approach.
Figure 1B:
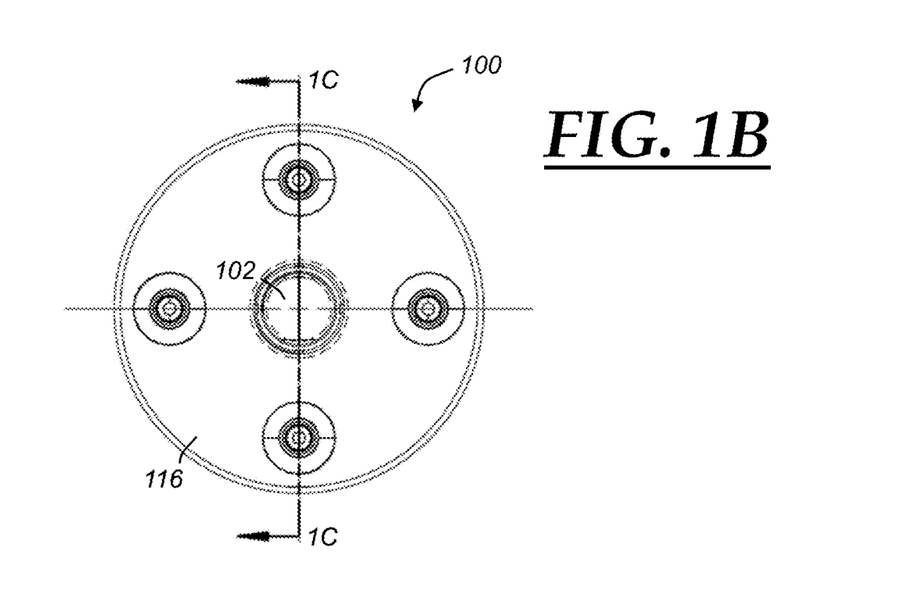
FIG. 1B is a top view of the partial discharge calibration standard apparatus of FIG. 1A.
Figure 1C:
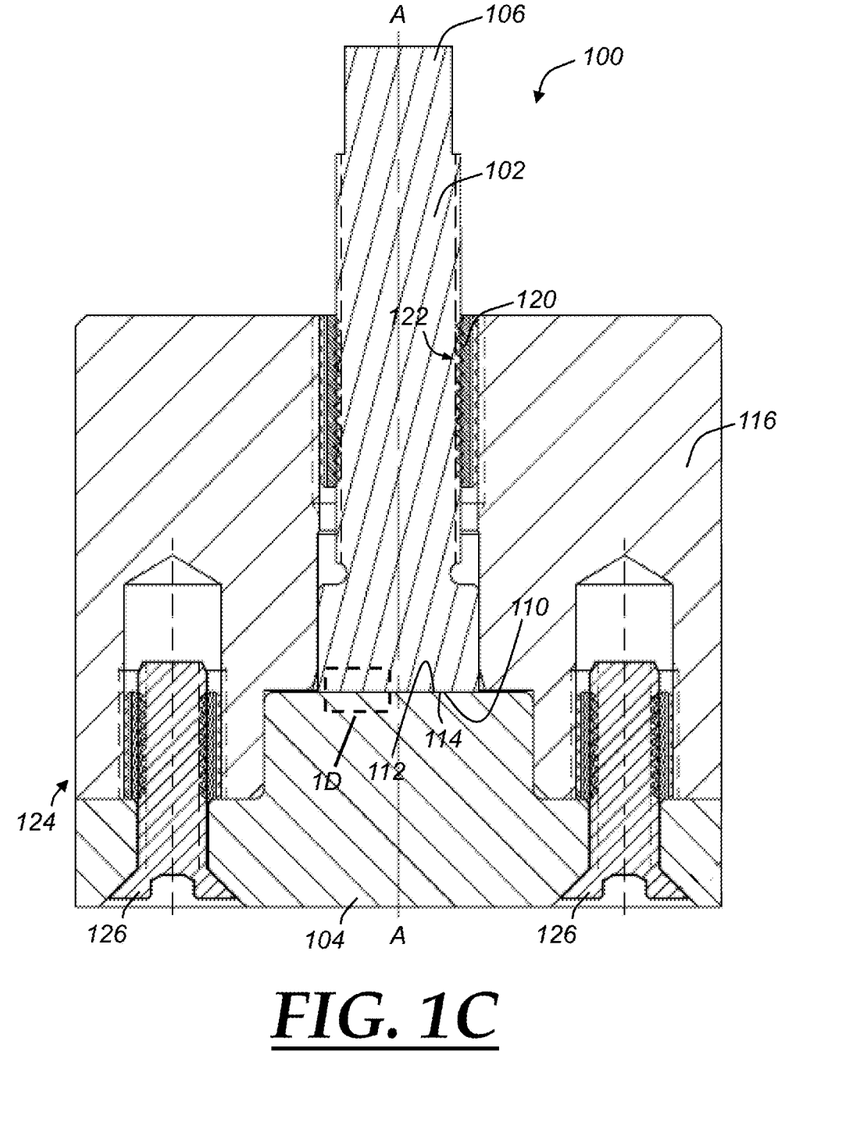
FIG. 1C is a section view of the partial discharge calibration standard apparatus of FIGS. 1A and 1B, taken through line 1C-1C of FIG. 1B.

The first and second facing surfaces 110, 112 may be any shape or configuration that is convenient. While the facing surfaces 110, 112 are generally circular as shown in the drawings, in other examples they may be square, rectangular, or any other shape that is convenient. The second facing surface 112 may be at least equal in size to the first facing surface 110, and may be larger than the first facing surface 110 in many embodiments. For example, as best seen in FIG. 1C the first facing surface 110 of the first member 102 may be smaller than the second facing surface 112 of the second member 104 such that a magnitude of the surface area of the first facing surface 110 is less than that of the second facing surface 112. In the example illustrated in FIGS. 1A-1D, the entire surface area of the first facing surface 110 may be contained within an outer perimeter of the second facing surface 112. For example, the circular facing surfaces 110, 112 may be concentric with respect to each other, with the axis A-A centering the surfaces 110, 112. The facing surfaces 110, 112 may be relatively closely positioned apart from each other on either side of an electrically insulating material 114. In some examples the facing surfaces 110, 112 are very close together, e.g., to a relative spacing of one (1.0) millimeter or less.

Figure 1D:
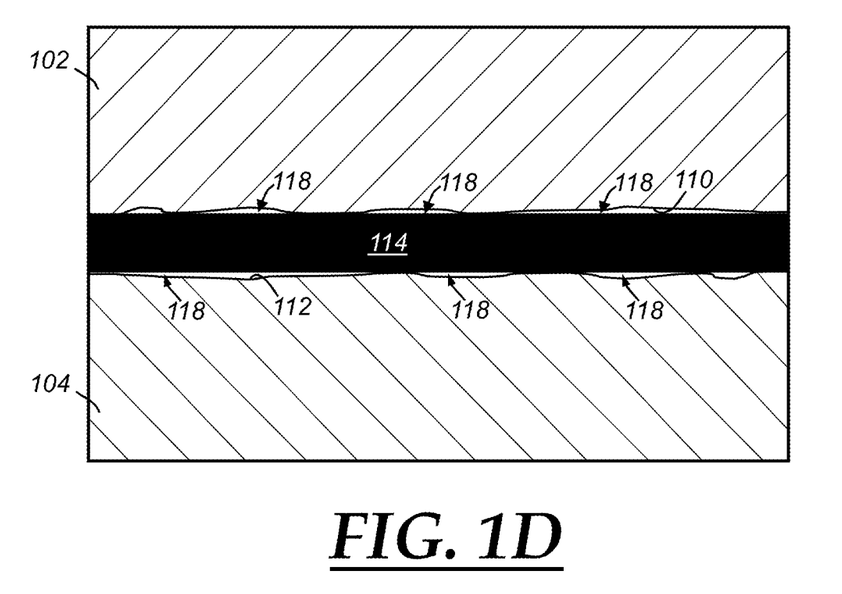
FIG. 1D is an enlarged portion of the partial discharge calibration standard apparatus of FIGS. 1A, 1B, and 1C, as indicated by zone 1D in FIG. 1C.

The insulating material 114 may be any electrically insulating material that is convenient. In one example, the insulating material 114 is a dielectric tape such as Kapton. The insulating material 114 may relatively thin, while defining one or more relatively small and distinct open spaces or voids 118 between the insulating material 114 and the surfaces 110 and 112. For example, as is shown in FIG. 1D, the surfaces 110 and 112 may have a surface roughness (exaggerated in FIG. 1D for the purposes of illustration) which cooperates with the insulating material 114 to define the voids 118 therebetween when the facing surfaces 110 and 112 are compressed against the insulating material 114. The insulating material 114 may be relatively compliant, at least in comparison to the relatively rigid first and second members 102, 104. Accordingly, increasing force or pressure between the first and second facing surfaces 110, 112 may further squeeze or compress the insulating material 114. Moreover, this increase in pressure between the facing surfaces 110/112 and the insulating material 114 may also cause a reduction in size or total volume of the voids 118 contained between the relatively compliant insulating material 114 and the surfaces 110/112 of the rigid members 102/104, respectively, as will be discussed further below.

The first and second members 102, 104 may be held or forced together against the insulating material 114 by way of a pressure member 116. The pressure member 116 may generally form a housing or structure about the first and second members 102, 104, particularly about the first and second facing surfaces 110, 112. The pressure member 116 may be formed of an insulative or otherwise non-conductive material, e.g., plastic, thereby forcing a partial discharge path to travel from the first member 102 to the second member 104 (or vice versa) across the insulating material 114 (and not via the pressure member 116).

Generally, the pressure member 116 maintains the first and second rigid members 102, 104 together with a force (i.e., urging the first and second facing surfaces 110, 112 toward each other). In so doing, the pressure member 116 generally fixes the first and second facing surfaces 110, 112 in relative position on either side of the insulating material 114. More specifically, the first and second facing surfaces 110, 112, are held in a substantially parallel spaced relation across the insulating material 114. In one example, substantially parallel for purposes of this disclosure may be defined as a variance of 20 microns or less in a direction perpendicular to the facing surfaces 110, 112. Accordingly, in the example illustrated in FIG. 1D, the voids 118 each define a depth (i.e., vertically or in a direction perpendicular to the plane of the insulating material 114) of 20 microns or less with respect to the insulating material 114.

As will be discussed further below, by fixing the first and second facing surfaces 110, 112 in the aforementioned spaced relation, a partial discharge threshold magnitude is determined for the apparatus 110. Accordingly, when an electrical potential difference exists between the first facing surface 110/first member 102 and the second facing surface 112/second member 104, the insulating material 114 will generally prevent a discharge of the electrical potential difference up to a certain magnitude of the electrical potential difference, depending in part upon the breakdown voltage of the material. At that (breakdown) voltage, an electrical short may occur between the facing surfaces 110 and 112. Thus, as an applied electrical potential difference is increased in magnitude, the proximity of the first and second facing surfaces 110, 112 and presence of the voids 118 between the insulating material 114 and the facing surfaces 110 and 112 will permit the electrical potential difference to create a partial discharge within the voids 118 as the electrical potential reaches this breakdown voltage. The voids 118, as noted above, are generally defined by the surface roughness of facing surfaces 110 and 112 and the material 114 in contact. As a partial discharge event is more likely for a given electrical potential difference where there are more voids 118 and/or the voids 118 have relatively larger size, the apparatus 100 may alter the voids 118 to thereby increase or decrease a partial discharge threshold magnitude.

A given partial discharge threshold magnitude of the apparatus 100 may be defined, for purposes of the examples herein, as an electrical potential difference between the first and second facing surfaces 110, 112 which will result in a partial discharge of the electrical potential difference between the first and second facing surfaces 110, 112. The magnitude of the partial discharge threshold magnitude may be determined at least in part by the distance between the first and second facing surfaces 110, 112 (i.e., with a relatively closer positioning resulting in a lower PD threshold magnitude), surface area(s) of the facing surfaces 110 and/or 112, and material characteristics of the insulating material 114 (e.g., insulating characteristics of the material making up the insulating material 114). Moreover, physical characteristics of the members 102/104 and the insulating material 114 (e.g., smoothness of the surface of the material 114, thickness of the material 114, compliance of the material 114 relative to that of the first/second members 102/104, etc.) may also influence the shape and size of the voids 118 defined between the insulating material 114 and the facing surfaces 110/112, further influencing a partial discharge threshold magnitude of the apparatus 100.

Accordingly, a partial discharge threshold magnitude may be varied by way of the pressure member 116, e.g., by varying an amount of pressure applied between the facing surfaces 110 and/or 112 and the insulating material 114. As shown in FIGS. 1A-1D, the pressure member 116 may have an end or engagement portion 124 that is held against the second rigid member 104 by way of one or more fasteners 126. In the example illustrated, four threaded screws 126 are spaced about the circular perimeter of the pressure member 116/second member 104. The first member 102 defines a bore having a threaded portion 122. The threaded portion 122 is mated with corresponding threads 120 of the pressure member 116. Accordingly, by rotating the first rigid member 102 about the axis A-A, the first member 102 may be translated within the bore of the pressure member 116 toward or away from the second member 104. With the pressure member 116 secured to the second member 104 by way of the screws 126, movement of the first member 102 toward the second member 104 brings the first facing surface 110 against the second facing surface 112, thereby squeezing the insulating material 114 between the first and second facing surfaces 110, 112. Moreover, a force applied between the first and second facing surfaces 110, 112 may be increased or decreased by rotating the first member 102 with respect to the pressure member 116 in the appropriate rotational direction.

Several aspects of the apparatus 100 may influence a partial discharge threshold magnitude. As noted above, the pressure member 116 may generally vary a force applied between the first and second facing surfaces 110, 112. The variance in force may adjust a relative size or thickness of the voids 118 (i.e., in a direction perpendicular to the first and second facing surfaces 110, 112) between the first and second facing surfaces 110, 112. Where the facing surfaces 110, 112 are relatively closer together, a partial discharge threshold magnitude may be reduced. An increase in force applied between the first and second facing surfaces 110, 112 may increase pressure within the insulating material 114, thereby reducing an overall volume or number of the voids 118 between the insulating material between the facing surfaces 110, 112.

As noted above, increases in pressure within the insulating material 114, e.g., via increased force between the facing surfaces 110, 112, generally lowers a voltage or electrical potential at which a partial discharge may occur between the facing surfaces 110, 112. Maximum pressure between the facing surfaces 110, 112 may generally be limited by the insulating material 114, to an extent excess pressure may damage the insulating material 114. On the other hand, where pressure within the insulating material 114 is too little, this may increase the size of the voids 118 to an extent that substantially prevents any partial discharge event. Moreover, the apparatus 100 advantageously provides a consistent partial discharge threshold magnitude, e.g., for use as a standard to determine whether a partial discharge measurement device is working correctly) and as such it is generally not necessary to excessively increase or reduce pressure in the insulating material 114. Rather, it is desirable to adjust the apparatus 100 to have a consistent amount of pressure within the insulating material 114, thereby facilitating a repeatable partial discharge event at a known electrical potential. Upon adjusting the apparatus 100 so that a consistent pressure within the insulating material 114 and/or a consistent partial discharge event is created at a certain electrical potential, the apparatus 100 may be used to determine whether a partial discharge measurement testing system or measuring device is working correctly (i.e., accurately measuring the occurrence of partial discharge events).

A relative humidity in the environment surrounding the apparatus 100 may also influence occurrence of partial discharge events. Accordingly, it may be beneficial to maintain a controlled humidity in/around the apparatus 100. Merely as one example, as will be described further below in regard to FIG. 2, a generally fluid-tight enclosure may be provided surrounding the apparatus 100, while permitting leads to be connected to the first/second members 102, 104. A humidity control may be positioned within the enclosure, e.g., a humidity control pack that keeps humidity within the enclosure at a predetermined percent or concentration.

Figure 2:
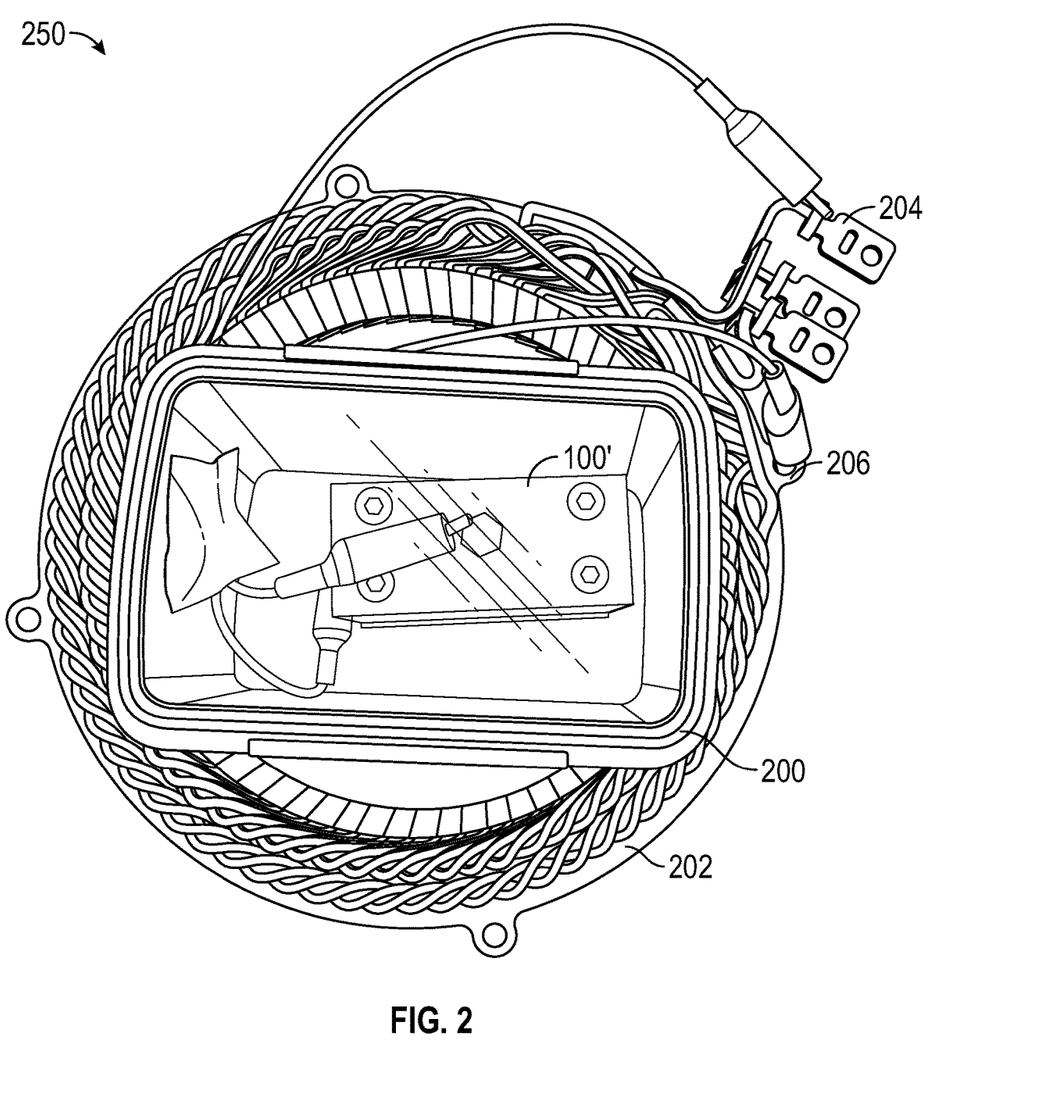
FIG. 2 is a photograph of an example partial discharge calibration standard apparatus configured to be installed to a stator test system, according to one example.

Turning now to FIG. 2, a photograph is shown of an example stator test apparatus 250 for installation into a stator insulation testing system (not shown). The test apparatus 250 may include an enclosure 200 mounted within a generally ring-shaped (mimicking that of a stator for an electric motor) stator body 202. The enclosure 200 may contain a partial discharge standard apparatus 100'. The enclosure 200 may generally be fluid-tight to an extent that humidity within the enclosure 200 is maintained at a predetermined amount. The apparatus 100', while being generally rectangular-shaped as illustrated, is otherwise substantially identical in construction to the apparatus 100 illustrated in FIGS. 1A-1D and described above. For example, the apparatus 100' includes first and second rigid members defining respective facing surfaces, which are positioned in spaced relation on either side of an insulating material.

The stator test apparatus 250 may include a first electrical lead 204 that allows an electrical potential to be placed in connection with a first member of the apparatus 100', e.g., via a lead 106 as illustrated above. Similarly, a second electrical lead 206 may be provided that is connected to the second member of the apparatus 100'. In this manner, an electrical potential difference may be applied between the first/second facing surfaces (not shown in FIG. 2) of the apparatus 100'. The stator body 202 may include one or more phase windings, which need not be operational in the context of usage of the apparatus 100'. That is, the stator test apparatus 250 may be used to test a stator insulation testing system (not shown) using the apparatus 100', and allowing mounting of the apparatus 100' via the stator body 202. As such, it may not be necessary for the phase windings of the stator body, while shown in FIG. 2, to be operational.

The apparatuses 100 and 100' may each generally provide a partial discharge standard that may be used to determine whether a partial discharge measurement system or device (not shown) is working correctly. Initially, the apparatus 100 may be tuned, e.g., by adjusting pressure within the insulating material 114, such that it is creating a partial discharge event at a known voltage (e.g., by measuring with a partial discharge measurement system that has been calibrated such that it is known to be working properly) corresponding to the partial discharge threshold magnitude within a desired tolerance range, e.g., 1% of the applied electrical potential. The apparatus 100 may then be used to determine whether another partial discharge measurement system/device is working properly, e.g., as discussed further below.

Figure 3:
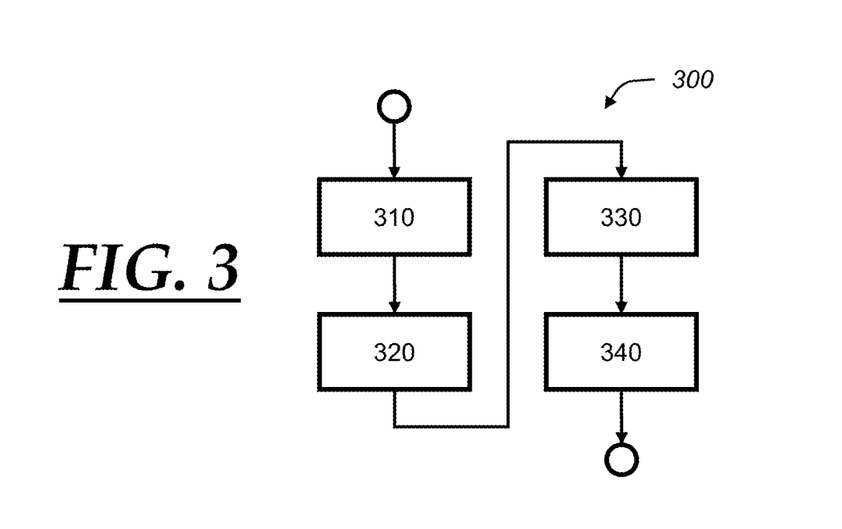
FIG. 3 is a process flow diagram for an example method of calibrating or testing a partial discharge measurement system or device.

Turning now to FIG. 3, an example process 300 of calibrating a partial discharge measurement system is illustrated. Process 300 may begin at block 310, where a partial discharge threshold magnitude may be determined for a PD standard apparatus, e.g., apparatus 100 or 100'. In one example, a PD measurement system that has been previously calibrated may be used to determine the applicable PD threshold magnitude for an apparatus 100 or 100'. Process 300 may then proceed to block 320.

At block 320, an electrical potential difference is applied across a partial discharge standard apparatus, e.g., apparatus 100 or 100'. More specifically, an electrical potential difference may be applied across the first and second members 102, 104 using the PD measurement system that is being tested.

Proceeding to block 330, the electrical potential difference may be increased gradually until a partial discharge event occurs in the apparatus 100/100' as measured by the PD measurement system/device that is being tested. Process 300 may then proceed to block 340.

At block 340, process 300 may compare the results of the PD event as measured by the PD measurement system under test with the known partial discharge threshold magnitude of the apparatus 100/100'. More specifically, the apparatus 100 or 100' is known to create a partial discharge event at the partial discharge threshold magnitude, and as such it may be determined whether the partial discharge measurement system/device under test is working properly by determining whether it detected the partial discharge event at the partial discharge threshold magnitude of the apparatus 100. Alternatively, if the PD measurement system/device "determines" that the PD event occurred at a different voltage, or does not detect a PD event at all, this may indicate that the PD measurement system/device is not working properly or needs calibration. Process 300 may then terminate.

By measuring PD activity of the PD measurement system using the apparatus 100 or 100', prediction of PD events with a high degree of accuracy may be facilitated, and ensure that a PD measurement system can accurately detect defects in an electric motor, e.g., by way of defects in the insulation of a stator body. In other words, to the extent measurement of partial discharge events in a stator of an electric motor may be measured accurately, quality of the stator and the motor overall may be ensured, thereby preventing defective stators/motors from being installed, e.g., in a vehicle. The apparatus 100 and 100' may each prevent false positive PD detection and/or failure to detect a PD event in a PD measurement system. The production of a PD event in the apparatuses 100 and 100' may therefore allow calibration of the PD measurement system and increase confidence that the measurement system is accurately detecting PD events.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. A partial discharge calibration standard apparatus, comprising:
   a first electrically conductive rigid member defining a first facing surface having a first surface area of a first magnitude;
   a second electrically conductive rigid member defining a second facing surface having a second surface area of a second magnitude at least as great as the first magnitude;
   an electrically insulating material disposed between the facing surfaces; and
   a pressure member maintaining the first and second rigid members together with a force having a force magnitude, thereby fixing the first and second facing surfaces in a substantially parallel spaced relation across the insulating material such that a partial discharge threshold magnitude for an electrical potential difference between the first and second facing surfaces is determined, wherein the insulating material prevents partial discharge of an electrical potential from the first facing surface to the second facing surface below the partial discharge threshold magnitude, and partially discharges the electrical potential difference from the first facing surface to the second facing surface through the insulating material when the electrical potential difference is increased to the partial discharge threshold magnitude and wherein the pressure member comprises a threaded portion engaging mating threads of the first rigid member, wherein rotation of the first rigid member adjusts the force magnitude.

2. The apparatus of claim 1, wherein the insulating material is a dielectric tape.

3. The apparatus of claim 1, wherein the pressure member is configured to vary the partial discharge threshold magnitude.

4. The apparatus of claim 3, wherein the pressure member is configured to vary the partial discharge threshold magnitude by adjusting the force magnitude.

5. The apparatus of claim 3, wherein the pressure member is configured to vary the partial discharge threshold magnitude by adjusting a relative spacing between the first and second facing surfaces across the insulating material.

6. The apparatus of claim 3, wherein the pressure member is configured to vary the partial discharge threshold magnitude by adjusting a material void magnitude between the insulating material and at least one of the facing surfaces.

7. The apparatus of claim 1, wherein the insulating material defines a partial discharge path including one or more micro voids positioned between the insulating material and at least one of the facing surfaces.

8. The apparatus of claim 1, wherein the pressure member is formed of a non-conductive material.

9. The apparatus of claim 1, wherein the first surface area of the first facing surface is positioned within a perimeter of the second facing surface.

10. The apparatus of claim 1, wherein the first and second members are each formed of a conductive material.

11. The apparatus of claim 1, wherein the first and second facing surfaces are machined.

12. The apparatus of claim 1, wherein the first and second facing surfaces are spaced apart by less than 1.0 millimeters across the electrically insulating material.

13. The apparatus of claim 12, wherein the first and second facing surfaces are parallel to each other such that a distance between the first and second facing surfaces varies by no more than 40 microns.

14. The apparatus of claim 1, further comprising a substantially fluid-tight enclosure containing the first and second members and the pressure member.

15. The apparatus of claim 1, further comprising a ring-shaped stator body, the first and second member and the pressure member contained within the ring-shaped stator body.

16. The apparatus of claim 1, wherein the pressure member comprises an engagement portion selectively fixed to the second rigid member.

17. A partial discharge calibration standard apparatus, comprising:
- a first electrically conductive rigid member defining a first facing surface having a first surface area of a first magnitude;
- a second electrically conductive rigid member defining a second facing surface having a second surface area of a second magnitude at least as great as the first magnitude;
- an electrically insulating material disposed between the facing surfaces, the electrically insulating material comprising a dielectric tape defining a plurality of voids therein; and
- a pressure member maintaining the first and second rigid members together with a force having a force magnitude, thereby fixing the first and second facing surfaces in a substantially parallel spaced relation across the insulating material such that a partial discharge threshold magnitude for an electrical potential difference between the first and second facing surfaces is determined, wherein the insulating material prevents partial discharge of an electrical potential from the first facing surface to the second facing surface below the partial discharge threshold magnitude, and partially discharges the electrical potential difference from the first facing surface to the second facing surface through the insulating material when the electrical potential difference is increased to the partial discharge threshold magnitude, wherein the pressure member is configured to vary the partial discharge threshold magnitude by adjusting a material void magnitude between the insulating material and at least one of the facing surfaces, and wherein the pressure member comprises a threaded portion engaging mating threads of the first rigid member, wherein rotation of the first rigid member adjusts the force magnitude.

18. A stator test apparatus, comprising:
- a ring-shaped body; and
- a partial discharge standard apparatus disposed within the body, including:
  - a first electrically conductive rigid member defining a first facing surface having a first surface area;
  - a second electrically conductive rigid member defining a second facing surface having a second surface area encompassing the first surface area;
  - an electrically insulating material disposed between the facing surfaces, the electrically insulating material comprising a dielectric tape defining a plurality of voids therein; and
  - an electrically non-conductive pressure member maintaining the first and second members together, thereby fixing the first and second facing surfaces in spaced relation across the insulating material, with the first and second facing surfaces spaced apart in a substantially parallel orientation, thereby forming a partial discharge path from the first facing surface to the second facing surface through the insulating material;
  - wherein the pressure member is configured to vary an applied force between the first and second facing surfaces, thereby varying an electrical potential threshold for the partial discharge path across the insulating material, wherein the pressure member is configured to vary the partial discharge threshold magnitude by adjusting a material void magnitude between the insulating material and at least one of the facing surfaces, and wherein the pressure member comprises a threaded portion engaging mating threads of the first rigid member, wherein rotation of the first rigid member adjusts the force magnitude.

19. The stator test apparatus of claim 18, further comprising a substantially fluid-tight enclosure containing the first and second members and the pressure member.

* * * * *